United States Patent
Song et al.

(10) Patent No.: US 10,523,042 B2
(45) Date of Patent: Dec. 31, 2019

(54) MASTER-SLAVE CHARGING CIRCUIT WITH SLAVE CHARGER INPUT CURRENT SENSING AND ADAPTIVE BATTERY CURRENT LIMITING

(71) Applicant: QUALCOMM Incorporated, San Diego, CA (US)

(72) Inventors: Chunping Song, Sunnyvale, CA (US); Jialei Xu, Santa Clara, CA (US); Stuart Pullen, Raleigh, NC (US); Steve Hawley, Emerald Hills, CA (US); Neal Horovitz, Los Altos, CA (US); Shashank Prakash Mane, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 174 days.

(21) Appl. No.: 15/712,770

(22) Filed: Sep. 22, 2017

(65) Prior Publication Data

US 2018/0331564 A1    Nov. 15, 2018

Related U.S. Application Data

(60) Provisional application No. 62/505,375, filed on May 12, 2017.

(51) Int. Cl.
*H01M 10/44* (2006.01)
*H01M 10/46* (2006.01)
(Continued)

(52) U.S. Cl.
CPC ............ *H02J 7/163* (2013.01); *H02J 7/0013* (2013.01); *H02J 7/0024* (2013.01)

(58) Field of Classification Search
CPC ............... H02J 7/0052; H02J 7/0055; H02J 2007/0059; H02J 2007/0095
(Continued)

(56) References Cited

U.S. PATENT DOCUMENTS 9,166,442 B1    10/2015    Belch et al.
9,590,436 B2    3/2017    Sporck et al.
(Continued)

FOREIGN PATENT DOCUMENTS

DE    102015118210 A1    5/2016
EP    1498998 A1    1/2005
(Continued)

OTHER PUBLICATIONS

International Search Report and Written Opinion—PCT/US2018/027547—ISA/EPO—dated Jul. 17, 2018.
(Continued)

*Primary Examiner* — Edward Tso
(74) *Attorney, Agent, or Firm* — QUALCOMM Incorporated/Patterson & Sheridan, L.L.P.

(57) ABSTRACT

Certain aspects of the present disclosure generally relate to reducing the size of parallel charging circuits for charging a battery in a portable device, while still effectively providing input current sensing and reverse current blocking capabilities. One example battery charging circuit generally includes: (1) a first charging circuit comprising a first charging output connectable to a battery and a first converter to provide power to the first charging output; and (2) a second charging circuit comprising a second charging output connectable to the battery, a second converter to provide power to the second charging output, a first transistor coupled between an output of the second converter and the second charging output, and a current-sensing circuit
(Continued)

coupled to the output of the second converter to sense a current through the first transistor.

27 Claims, 9 Drawing Sheets

(51) Int. Cl.
*H02J 7/16* (2006.01)
*H02J 7/00* (2006.01)

(58) Field of Classification Search
USPC .............................. 320/127, 128, 137, 138
See application file for complete search history.

(56) References Cited

U.S. PATENT DOCUMENTS

2012/0081071 A1* 4/2012 Asakura ................ H02J 7/0068
320/109
2015/0115713 A1 4/2015 Kim et al.
2017/0085108 A1 3/2017 Zhang

FOREIGN PATENT DOCUMENTS

| EP | 3151369 A1 | 4/2017 |
|---|---|---|
| JP | 2011176959 A | 9/2011 |
| WO | WO-2014189629 A1 | 11/2014 |
| WO | WO-2016020235 A2 | 2/2016 |
| WO | WO-2016176032 A1 | 11/2016 |

OTHER PUBLICATIONS

"TI Designs: Cascade Dual Charger Reference Design for 1S Li-Ion Battery-Powered End Equipment", Texas Instruments Incorporated, TIDUC 92—Nov. 2016, 13 Pages.

* cited by examiner

MASTER-SLAVE CHARGING CIRCUIT WITH SLAVE CHARGER INPUT CURRENT SENSING AND ADAPTIVE BATTERY CURRENT LIMITING

CLAIM OF PRIORITY UNDER 35 U.S.C. §§ 119 AND 120

The present application claims benefit of U.S. Provisional Patent Application Ser. No. 62/505,375, filed May 12, 2017, which is herein incorporated by reference in its entirety.

TECHNICAL FIELD

Certain aspects of the present disclosure generally relate to electronic circuits and, more particularly, to parallel battery charging circuits.

BACKGROUND

Power management integrated circuits (power management ICs or PMICs) are used for managing the power requirement of a host system. A PMIC may be used in battery-operated devices, such as mobile phones, tablets, laptops, wearables, etc., to control the flow and direction of electrical power in the devices. The PMIC may perform a variety of functions for the device such as DC-to-DC conversion, battery charging, power-source selection, voltage scaling, power sequencing, etc. In some cases, the PMIC may include parallel battery charging circuits.

SUMMARY

Certain aspects of the present disclosure generally relate to techniques and apparatus for operating a parallel battery charging circuit capable of charging a battery.

Certain aspects of the present disclosure provide a battery charging circuit. The battery charging circuit includes a first charging circuit and a second charging circuit. The first charging circuit generally includes a first charging output connectable to a battery and a first converter to provide power to the first charging output. The second charging circuit generally includes a second charging output connectable to the battery, a second converter to provide power to the second charging output, a first transistor coupled between an output of the second converter and the second charging output, and a current-sensing circuit coupled to the output of the second converter to sense a current through the first transistor.

Certain aspects of the present disclosure provide a method of operating a battery charging circuit including a first charging circuit and a second charging circuit for concurrently charging a battery. The method generally includes driving a first converter in the first charging circuit, driving a second converter in the second charging circuit, and sensing a charging current for charging the battery from the second charging circuit, based on an output of the second converter, to effectively sense an input current for the second charging circuit.

Certain aspects of the present disclosure provide an apparatus for charging a battery. The apparatus generally includes first means for converting a first current; second means for converting a second current, the second means for converting being coupled to the first means for converting; and means for sensing a charging current for charging the battery from the second means for converting, based on an output of the second means for converting, to effectively sense an input current for the second means for converting.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

Figure 1:
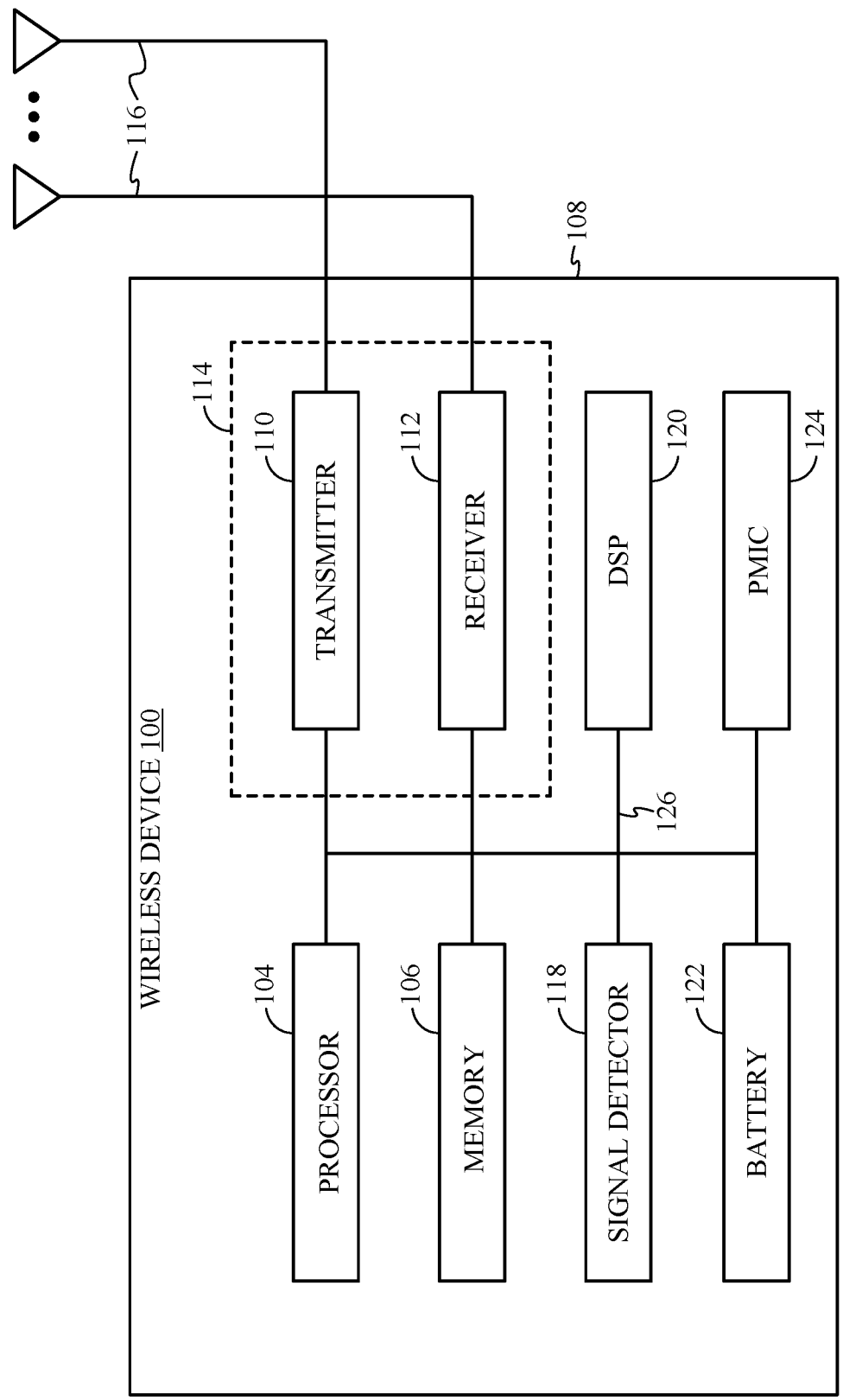
FIG. 1 illustrates a block diagram of an example device that includes a battery charging circuit, according to certain aspects of the present disclosure.

FIG. 1 illustrates an example device 100 in which aspects of the present disclosure may be implemented. The device 100 may be a battery-operated device such as a cellular phone, a personal digital assistant (PDA), a handheld device, a wireless device, a laptop computer, a tablet, a smartphone, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include a battery charging circuit (e.g., a master-slave battery charging circuit), as described below. The various components of the device 100 may be coupled together by a bus system 126, which may include a power bus, a control signal bus, and/or a status signal bus in addition to a data bus.

Example Slave Charger Input Current Sensing

In order to charge the battery (e.g., battery 122) in a portable device, a battery charging circuit may be utilized. For certain aspects, the battery charging circuit may reside in a PMIC (e.g., PMIC 124). The battery charging circuit may comprise two or more parallel charging circuits, each capable of charging the battery, which may be connected together and to the battery in an effort to provide fast charging of the battery. The parallel charging circuits can be configured so that these circuits do not adversely interfere with each other during battery charging (e.g., in a master-slave relationship). Example master-slave battery charging circuits are described in U.S. Pat. No. 9,590,436 to Sporck et al., filed Apr. 11, 2014 and entitled "Master-Slave Multi-Phase Charging," herein incorporated by reference in its entirety. Two example parallel charging architectures include connection of: (1) a USBIN terminal on the master charging circuit to a VIN terminal on the slave charging circuit (VIN_s) (referred to as a "USBIN-VIN configuration"); or (2) a MID terminal on the master charging circuit (MID_m) to a MID terminal on the slave charging circuit (MID_s) (referred to as a "MID-MID configuration").

In contemporary charger designs on the market, the slave charging circuit may use a front porch field-effect transistor (FPFET) to handle: (1) input current sensing and (2) reverse current blocking of a leakage path from the battery to the power input while charging is disabled. This is typically done because the charger normally provides power (at a VPH_PWR terminal) while charging is disabled. The FPFET is operating in a high voltage (HV) condition, and such HV circuitry takes up significant area (e.g., >1 mm$^2$) in a portable device. A VSYS terminal of the slave charging circuit (VSYS_s) may be separated from the VPH_PWR terminal of the master charging circuit by two battery field-effect transistors (BATFETs), and this VSYS_s terminal may have no system load demand. Thus, when charging is disabled, the charger need not keep VSYS_s biased.

There may be several problems associated with traditional slave charging circuits (either USBIN-VIN or MID-MID configuration). For example, the FPFET and its gate control and current-sensing circuitry (operating in the HV domain) may take up significant area (e.g., ~15% of the total die area). Being in the input current path of the slave charging circuit, the FPFET also has a power loss associated therewith. Furthermore, input current control for the slave charging circuit may either be complicated (in the USBIN-VIN configuration) or not functional (in the MID-MID configuration).

Certain aspects of the present disclosure provide a battery charging circuit that removes the FPFET for the slave charging circuit and provides support for a USBIN-to-VIN connection. Other small circuitry may be used to handle input current sensing and reverse current blocking. In this manner, the area of the removed FPFET and corresponding circuitry may be saved, and the USBIN-to-VIN connection is an option for board-level layout flexibility.

Figure 2A:
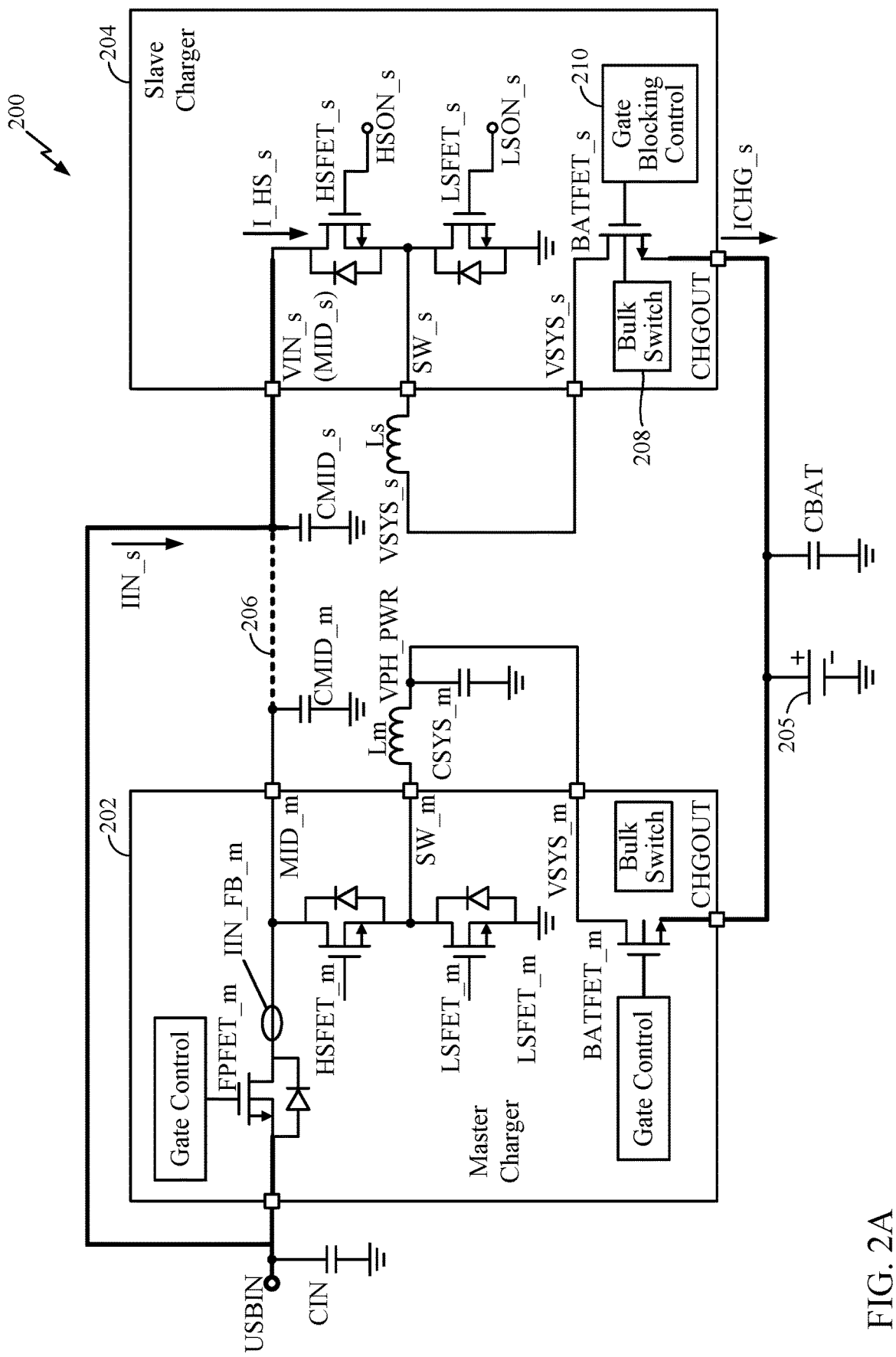
FIG. 2A is a circuit diagram of an example master-slave battery charging circuit, in accordance with certain aspects of the present disclosure.

FIG. 2A is a circuit diagram of an example master-slave battery charging circuit 200, in accordance with certain aspects of the present disclosure. The master-slave battery charging circuit 200 includes a master charging circuit 202 and a slave charging circuit 204 for charging battery 205 and capacitor CBAT. This circuit 200 may support a USBIN-to- VIN_s connection and eliminate the FPFET for the slave charging circuit (FPFET_s). The circuit 200 may effectively generate input current feedback based on BATFET_s current (charge current) feedback, as described in greater detail below. Control circuitry may be added in an effort to use BATFET_s as a blocking FET when charging is disabled, as also described in greater detail below. This is possible because VSYS_s does not see any load when charging is disabled. While the circuit 200 can support USBIN-VIN without a FPFET_s, the circuit 200 can also support the traditional MID-MID configuration if desired, as indicated by the dashed line 206.

The master charging circuit 202 includes a FPFET_m, a DC/DC converter circuit comprising a high-side FET (HSFET_m) and a low-side FET (LSFET_m), and a BATFET_m. The slave charging circuit 204 includes: (1) a DC/DC converter circuit comprising a high-side FET (HSFET_s) and a low-side FET (LSFET_s) and (2) a BATFET_s. The VIN_s terminal (also referred to as the MID_s terminal) may be connected to the drain of HSFET_s, the source of HSFET_s may be connected to the SW_s terminal and to the drain of LSFET_s, and the source of LSFET_s may be connected to a reference potential (e.g., electrical ground) for the slave charging circuit 204. The gate of HSFET_s may be driven by HSON_s, while the gate of LSFET_s may be driven by LSON_s (not shown). Both HSON_s and LSON_s may be generated by a pulse-width modulator (not shown in FIG. 2A) such that HSFET_s, LSFET_s, and inductor Ls may operate as a synchronous buck converter.

The circuit 200 may also include external components (e.g., external to the ICs for the master charging circuit 202 and/or the slave charging circuit 204. For example, external components associated with the master charging circuit 202 may include: (1) a capacitor CMID_m connected to the MID_m terminal and (2) an inductance-capacitance (LC) circuit comprising an inductor Lm and a capacitor CSYS_m, with an input connected to the SW_m terminal and an output connected to the VSYS_m terminal. External components associated with the slave charging circuit 204 may include: (1) a capacitor CMID_s connected to the VIN_s (MID_s) terminal and (2) an inductor Ls connected between the SW_s terminal and the VSYS_s terminal.

Figure 3A:
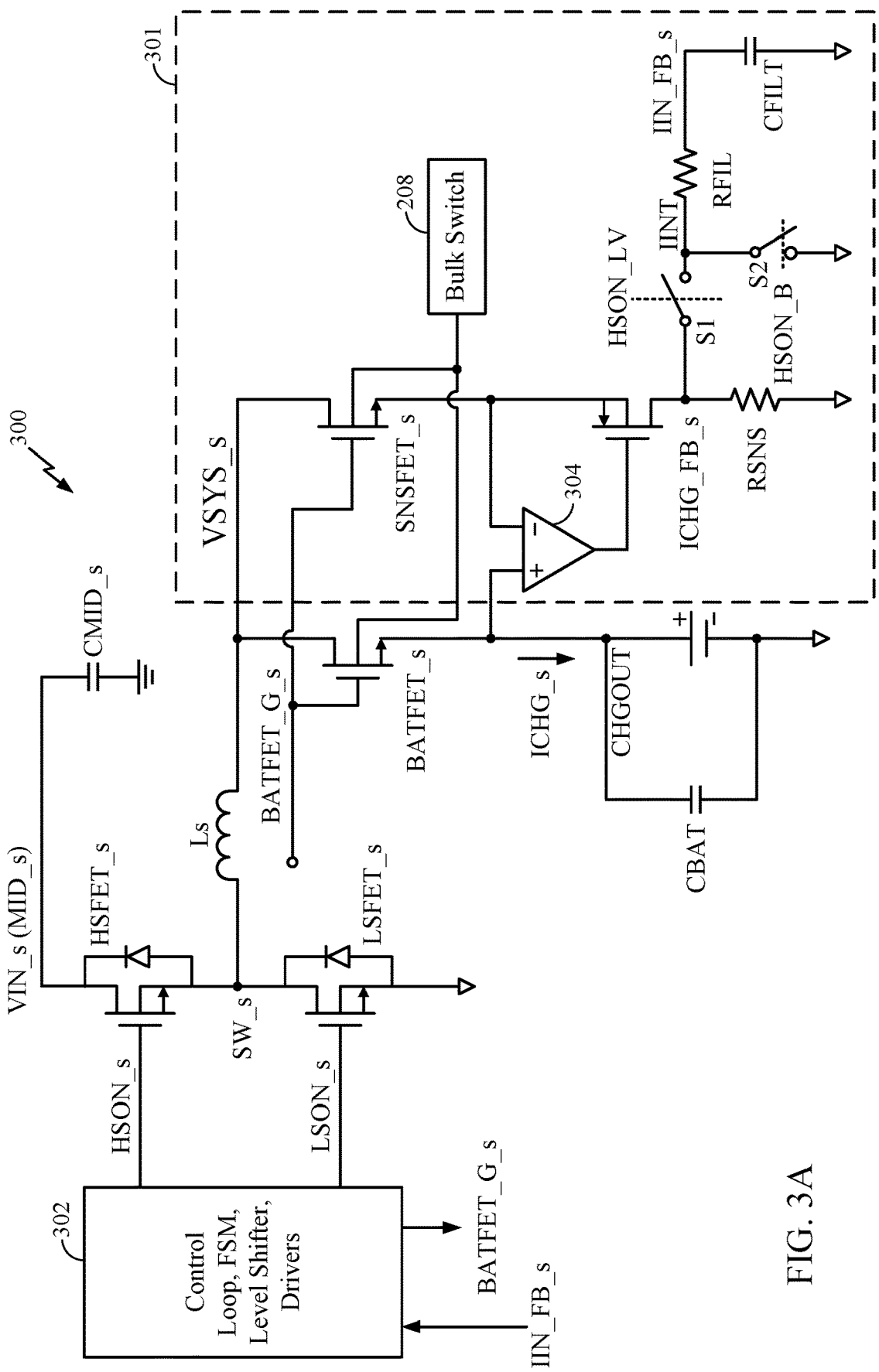
FIG. 3A is a circuit diagram of an example slave battery charging circuit in the master-slave battery charging circuit of FIG. 2A, illustrating slave charging current sensing, in accordance with certain aspects of the present disclosure.

Compared to contemporary master-slave battery charging circuits, the circuit 200 may have no capacitor or a small capacitor (CSYS_s, not shown) connected to the VSYS_s terminal. This may be to guarantee that BATFET_s sees a similar current as the inductor Ls and HSFET_s while HSFET_s is turned on (e.g., while HSON_s is logic high), for the purpose of current-sensing with BATFET_s, instead of with a nonexistent FPFET_s. Sample circuitry and a filter (as illustrated in FIG. 3A and described below) may be added to the slave charging circuit 204 for charge current feedback. For reverse blocking for certain aspects, BATFET_s may be placed in an off state when charging is disabled by the bulk switch control circuit 208 and the gate blocking control circuit 210.

Figure 2B:
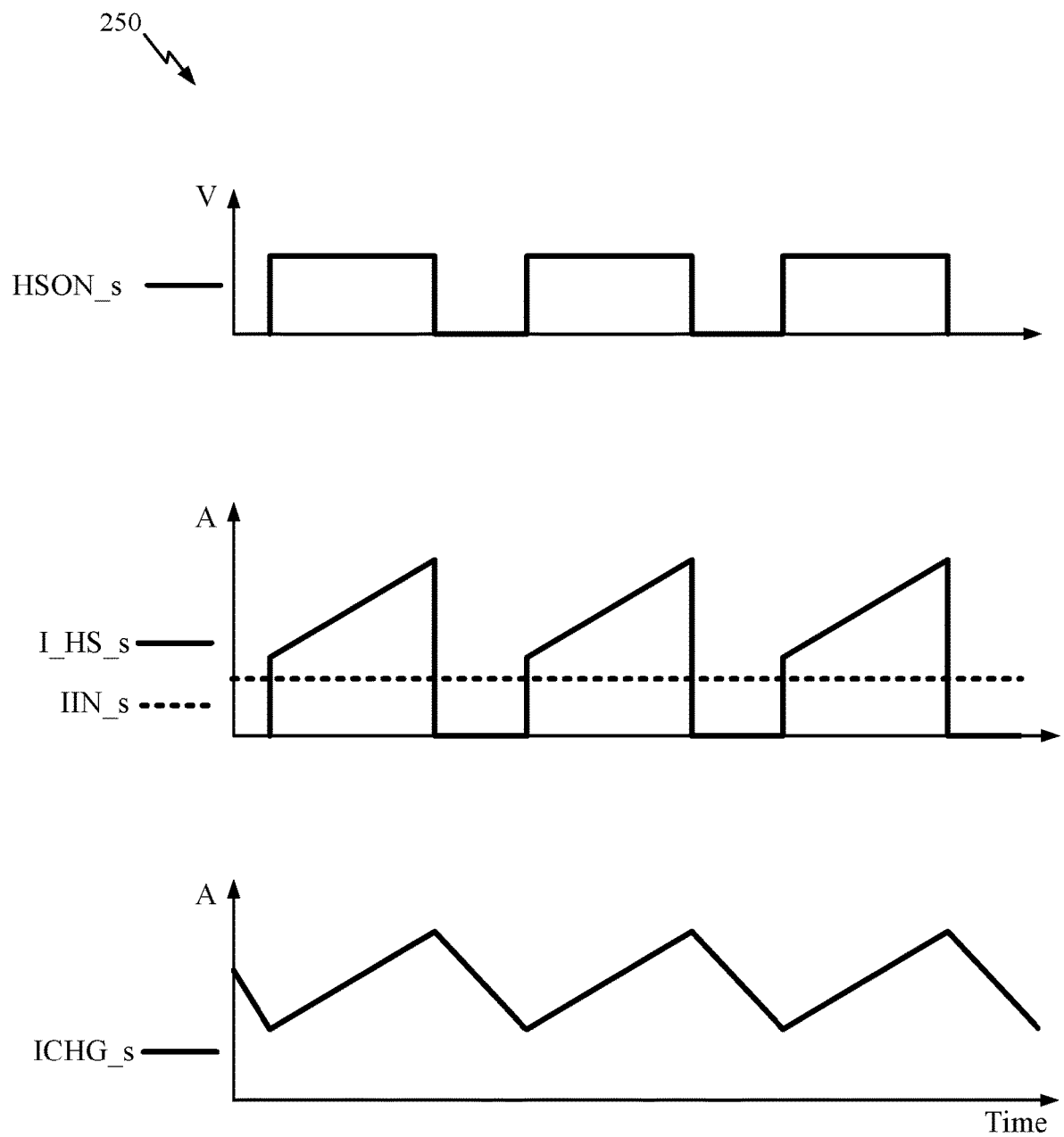
FIG. 2B illustrates example signal waveforms for the battery charging circuit of FIG. 2A, in accordance with certain aspects of the present disclosure.

FIG. 2B is a plot 250 of example signal waveforms for the battery charging circuit 200 of FIG. 2A, in accordance with certain aspects of the present disclosure. Illustrated are HSON_s (the gate drive signal for HSFET_s), I_HS_s (the current through HSFET_s), IIN_s (the input current from the USBIN terminal to the capacitor CMID_s), and ICHG_s (the current through BATFET_s and out of the CHGOUT terminal of the slave charging circuit 204). Although IIN_s remains nearly constant, I_HS_s increases while HSFET_s is turned on (while HSON_s is logic high) and then drops to zero when HSFET_s is turned off (while HSON_s is logic low). The inductor Ls prevents ICHG_s from changing instantaneously, and thus, ICHG_s increases with time while HSON_s is logic high and decreases with time while HSON_s is logic low (and LSON_s is logic high). This sawtooth-shaped current signal for ICHG_s is referred to in the field of power supplies as ripple current.

Figure 3B:
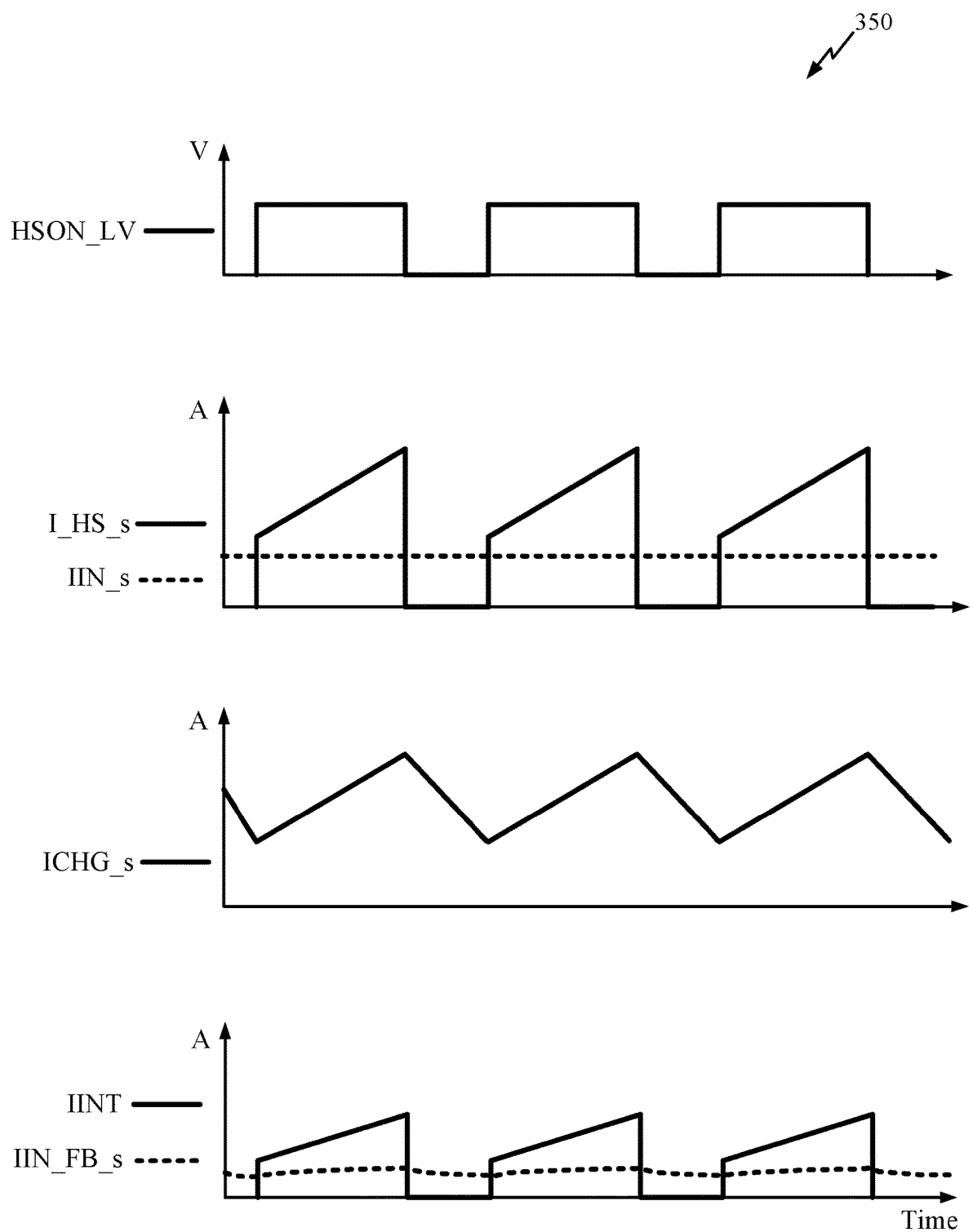
FIG. 3B illustrates example signal waveforms for the battery charging circuit of FIG. 3A, in accordance with certain aspects of the present disclosure.

The effective input current feedback based on replicated BATFET_s current sensing is described with respect to the example slave charging circuit 300 of FIG. 3A and the plot 350 of FIG. 3B illustrating example waveforms associated therewith. The slave charging circuit 300 may be incorporated into the battery charging circuit 200 of FIG. 2 and replace at least a portion of the slave charging circuit 204. In a parallel charging configuration, the slave charger's DC/DC converter output (VSYS_s) may be used solely for providing charging current for the battery (as opposed to also powering other components, as in the case of VPH_PWR). Thus, charging current through the slave BATFET_s (ICHG_s) is the output current of the slave charger DC/DC converter with VSYS capacitor (CSYS_s) removed.

A simple and accurate solution to effectively sense the input current for the slave charger may be provided by a current-sensing circuit 301. The current-sensing circuit 301 may include a sensing FET (SNSFET_s), an amplifier 304, a charging current feedback FET (ICHG_FB_s), a current-sensing resistor (RSNS), two switches (S1 and S2), and a resistor-capacitor (RC) filter (comprising resistor RFIL and capacitor CFILT). The signals for driving HSFET_s and LSFET_s (namely HSON_s and LSON_s) may be generated by and output from a control circuit 302. The drain of SNSFET_s may be connected with the VSYS_s terminal, which is also connected with the drain of BATFET_s. The gates of BATFET_s and SNSFET_s may be connected together and controlled by a gate control signal BATFET_G_s. BATFET_G_s may be output by the control circuit 302 or by gate blocking control circuit 210 (which may be part of the control circuit 302). The bodies of BATFET_s and SNSFET_s may be connected together and controlled by the bulk switch control circuit 208 (which may be separate from or incorporated into the control circuit 302). The source of BATFET_s may be connected with an input terminal (e.g., the positive terminal) of the amplifier 304, and the source of SNSFET_s may be connected with another input terminal (e.g., the negative terminal) of the amplifier and with the source of ICHG_FB_s. The output of the amplifier 304 may be connected with the gate of ICHG_FB_s, and the drain of ICHG_FB_s may be connected with one terminal of resistor RSNS. In this manner, amplifier 304 will drive the gate of ICHG_FB_s so that voltages at the sources of BATFET_s and SNSFET_s are equal (e.g., equal within an offset voltage parameter of the amplifier). Thus, with the drains and gates of BATFET_s and SNSFET_s also having the same voltages, the drain-to-source currents through BATFET_s and SNSFET_s should be nearly equal (e.g., within 5% of each other). Thus, the current through ICHG_FB_s (replicating the actual charging current through BATFET_s) may be sensed by the resistor RSNS to provide a measurement of ICHG_s as feedback for the control circuit 302.

With this circuit 300, gate control signal HSON_s is logic high to turn on HSFET_s. Sample switch S1 for sampling ICHG_FB_s through resistor RSNS is closed by control signal HSON_LV (a low-voltage version of HSFET_s gate driver HSON_s, which may be generated by the control circuit 302) while HSFET_s conducts current. Electrical ground (GND) sample switch S2 is open during this interval, and thus, the node labeled "IINT" increases in voltage with time as the current ICHG_FB_s ramps up with time. HSON_LV is logic low when HSFET_s is turned off (HSON_s goes low), and HSON_B is logic high. During this interval, switch S1 is open, and switch S2 is closed by control signal HSON_B to pull the node labeled "IINT" to ground. Designed to be roughly the inverse of HSON_LV, HSON_B may also be generated by the control circuit 302. The RC network is used to filter out high-frequency components and generate effective input current feedback signal IIN_FB_s, a voltage signal. Indicative of a current signal approximating IIN_s, IIN_FB_s may be converted to a digital signal by an analog-to-digital converter (ADC) and processed by the control circuit 302. The control circuit 302 may adjust the duty cycles of the HSON_s and LSON_s gate drive signals based on IIN_FB_s to regulate the charging current ICHG_s. One source of error may be due to the charge current sense amplifier bandwidth limit and feedback delay, which may be mitigated by a delayed HSON_LV control signal, delayed with respect to HSON_s.

One alternative solution for input current sensing without FPFET_s is to sense the input current through HSFET_s, rather than based on current through BATFET_s. However, with BATFET_s current sensing, the circuitry is implemented in a medium-voltage (MV) domain, rather than a high-voltage (HV) domain. Circuitry for the MV domain may take up much smaller area than the same circuitry for the HV domain. Furthermore, compared to un-compensated HSFET_s current sensing, BATFET_s current sensing may not see the errors contributed by blanking time, due to amplifier output slew rate during HSON_s.

Figure 4:
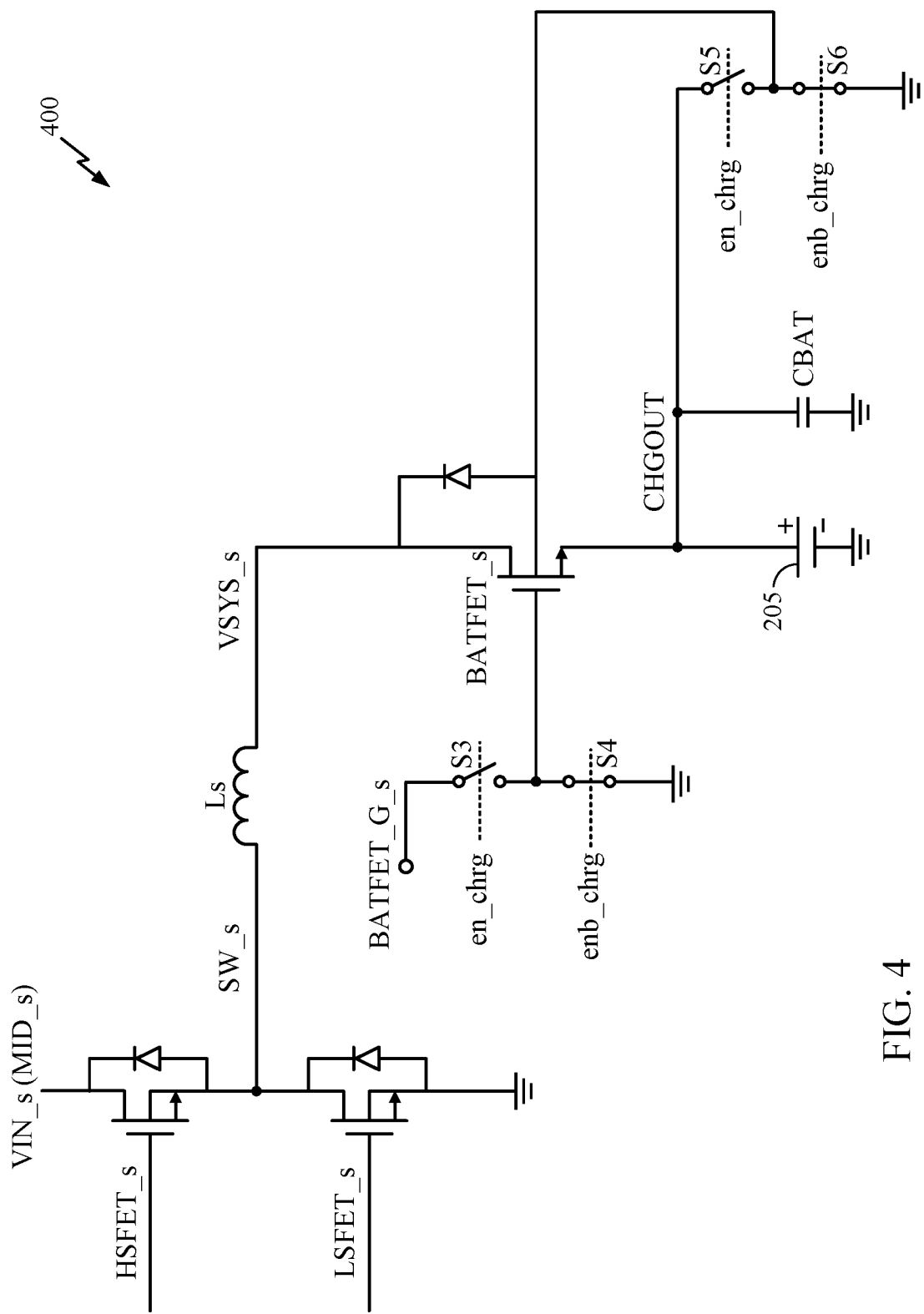
FIG. 4 is a circuit diagram of an example slave battery charging circuit in the master-slave circuit of FIG. 2A, illustrating reverse current blocking associated with BAT-FET_s, in accordance with certain aspects of the present disclosure.

For certain aspects, the slave charger may provide for reverse current blocking of a leakage path from the battery to the power input while charging is disabled. FIG. 4 is a circuit diagram of an example slave charging circuit 400, illustrating reverse current blocking associated with BATFET_s, in accordance with certain aspects of the present disclosure. The slave charging circuit 400 may be incorporated into the battery charging circuit 200 of FIG. 2 and replace at least a portion of the slave charging circuit 204. For certain aspects, a portion of the slave charging circuit 400 may be combined with a portion of the slave charging circuit 300.

The slave charging circuit 400 includes switches S3, S4, S5, and S6. Switches S3 and S5 may be controlled by a charging enabled control signal (en_chrg), while switches S4 and S5 may be controlled by a charging disabled control signal (enb_chrg). These control signals may be generated by the control circuit 302 or by the bulk switch control circuit 208 (which may be part of the control circuit 302 for certain aspects). Although enb_chrg is approximately the inverse of en_chrg, the rising edge of enb_chrg may lag the falling edge of en_chrg, and the falling edge of enb_chrg may lead the rising edge of en_chrg, to effectuate break-before-make switching and avoid shorting the CHGOUT terminal to ground.

In parallel charging configurations, when charging is disabled (en_chrg is logic low and enb_chrg is logic high), BATFET_s can be turned off because of no system current (e.g., the VSYS_s terminal is not loaded). In this condition, both HSFET_s and LSFET_s are turned off, switches S3 and S5 are open, and switches S4 and S6 are closed. Thus, BATFET_s is configured in a blocking state by pulling both the gate and bulk terminals of BATFET_s to ground, as illustrated in FIG. 4. This effectively blocks the reverse leakage from CHGOUT to VIN_s (MID_s), which may have been handled by FPFET_s in traditional chargers. When charging is resumed (en_chrg is logic high and enb_chrg is logic low), switches S3 and S5 are closed, and switches S4 and S6 are open. Thus, the source and bulk terminals of BATFET_s are connected together, and the gate terminal of BATFET_s may be connected to the control signal BATFET_G_s.

Without a slave FPFET, the slave charging circuit described herein still provides effective input current sensing and reverse blocking. By using a small or no VSYS capacitor, the BATFET_s current (i.e., ICHG_s) may be a suitable representation of the inductor current in the slave DC/DC converter. A (delayed) internal MV level high-side FET on signal (e.g., HSON_LV) may be used to sample the replicated battery current and generate a feedback signal while HSFET_s is turned on. This method may provide around 5% input current accuracy based on existing operating conditions (1 to 5 A). For reverse blocking, both the BATFET_s gate and body may be pulled down to ground, while charging is disabled, to block any current path from CHGOUT to VIN_s (MID_s). This serves as a way to block battery leakage to VIN_s (MID_s) when VIN_s (MID_s) is lower than the battery voltage.

Figure 5:
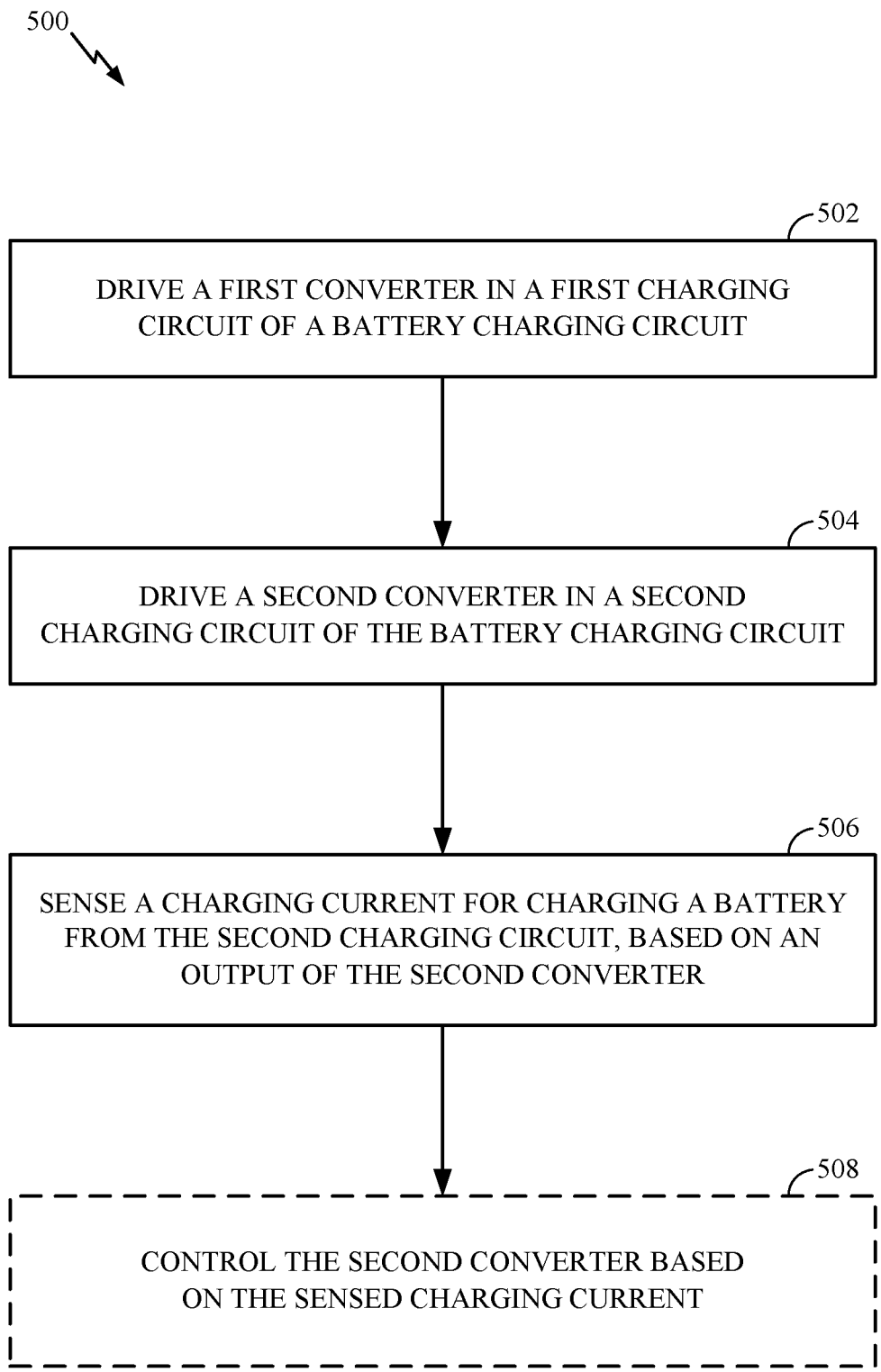
FIG. 5 is a flow diagram of example operations for running a parallel battery charging circuit, in accordance with certain aspects of the present disclosure.

FIG. 5 is a flow diagram of example operations 500 for running a parallel battery charging circuit, in accordance with certain aspects of the present disclosure. The operations 500 may be performed by a parallel battery charging circuit, such as the master-slave battery charging circuit 200 of FIG. 2A with a slave charging circuit including portions from FIGS. 2A, 3A, and/or 4.

The operations 500 may begin, at block 502, with the battery charging circuit driving a first converter (e.g., the synchronous buck converter that includes HSFET_m, LSFET_m, inductor Lm, and capacitor CSYS_m) in a first charging circuit (e.g., the master charging circuit 202). At block 504, the battery charging circuit may drive a second converter (e.g., the synchronous buck converter that includes HSFET_s, LSFET_s, and inductor Ls) in a second charging circuit (e.g., the slave charging circuit 204). At block 506, the battery charging circuit may sense a charging current (e.g., ICHG_s) for charging a battery (e.g., battery 205) from the second charging circuit, based on an output (e.g., VSYS_s) of the second converter, to effectively sense an input current (e.g., IIN_s) for the second charging circuit. As used herein, sensing a charging current may refer to sensing the charging current directly or indirectly (e.g., sensing a replica of the charging current).

According to certain aspects, the second charging circuit includes a first transistor (e.g., BATFET_s) coupled between the output of the second converter and the battery, a second transistor (e.g., SNSFET_s) coupled to the output of the second converter, a sensing resistor (e.g., resistor RSNS), a third transistor (e.g., ICHG_FB_s) coupled between the second transistor and the sensing resistor, and an amplifier (e.g., amplifier 304). The amplifier may have a first input coupled to the first transistor, a second input coupled to a node between the second transistor and the third transistor, and an output coupled to the third transistor. For certain aspects, sensing the charging current (to effectively sense the input current) at block 506 may entail sensing a replica of the charging current (e.g., the current through ICHG_FB_s). In this case, sensing the charging current (to effectively sense the input current) at block 506 may involve driving a gate of the first transistor and a gate of the second transistor with a same gate voltage and driving a gate of the third transistor with the output of the amplifier such that a first voltage at the first input is equal to a second voltage at the second input. For certain aspects, sensing the charging current (to effectively sense the input current) at block 506 may include closing a first switch (e.g., switch S1) having a terminal coupled to the third transistor and to the sensing resistor during a first interval (e.g., HSON_LV is logic high) and opening the first switch during a second interval (e.g., HSON_LV is logic low). In this case, the first and second intervals may be based on timing of a control signal (e.g., HSON_s) for a high-side transistor (e.g., HSFET_s) in the second converter. For certain aspects, sensing the charging current (to effectively sense the input current) at block 506 may further involve opening, during the first interval, a second switch (e.g., switch S2) coupled between another terminal of the first switch and a reference potential node (e.g., ground) of the second charging circuit, closing the second switch during the second interval, and low-pass filtering a voltage signal (e.g., voltage at the node labeled "IINT") at the other terminal of the first switch during the first and second intervals. In this case, the filtered voltage signal (e.g., IIN_FB_s) may represent the input current (e.g., IIN_s) for the second charging circuit. For certain aspects, the operations 500 may further include controlling the second converter based on the sensed charging current to adjust the charging current (as well as the input current) from the second charging circuit. For certain aspects, the operations 500 may further entail disabling charging by the battery charging circuit; disconnecting a gate of the first transistor from a control signal (e.g., BATFET_G_s); connecting the gate of the first transistor to a reference potential node (e.g., ground) for the second charging circuit; disconnecting a body of the first transistor from a source of the first transistor; and connecting the body of the first transistor to the reference potential node for the second charging circuit. For certain aspects, the operations 500 may further involve enabling charging by the battery charging circuit; disconnecting the gate of the first transistor from the reference potential node for the second charging circuit; connecting the gate of the first transistor to the control signal; disconnecting the body of the first transistor from the reference potential node for the second charging circuit; and connecting the body of the first transistor to the source of the first transistor.

According to certain aspects, the second converter includes a first transistor (e.g., HSFET_s), a second transistor (e.g., LSFET_s) coupled to the first transistor, and an inductor (e.g., inductor Ls) having a terminal (e.g., the SW_s terminal) coupled to a node between the first and second transistors and another terminal (e.g., the VSYS_s terminal) coupled to the output of the second converter. In this case, a capacitor coupled to the other terminal of the inductor is absent from the second converter.

According to certain aspects, the operations 500 further entail controlling the second converter based on the sensed charging current, at optional block 508. In this case, the second converter may include a first transistor (e.g., HSFET_s), a second transistor (e.g., LSFET_s) coupled to the first transistor, and an inductor (e.g., inductor Ls) having a terminal (e.g., the SW_s terminal) coupled to a node between the first and second transistors and another terminal (e.g., the VSYS_s terminal) coupled to the output of the second converter. For certain aspects, controlling the second converter at block 508 may include adjusting duty cycles of signals driving gates of the first and second transistors, based on the sensed charging current. In this manner, the charging current (as well as the input current) may be regulated with feedback.

There are several advantages and benefits to the slave charging circuits described herein. For example, significant area (e.g., >1 mm$^2$) may be saved by removing FPFET_s and related circuitry, which may be more than 15% of the total area of conventional slave chargers. Most of the existing core circuitries for BATFET control and charger current sensing may be re-used, with the addition of small sample circuitry and digital control. HV circuitry biasing for FPFET_s and input current sensing may be removed, and the design of the parallel charger is simplified. Certain aspects of the present disclosure support either a MID-VIN (utilize master charger's FPFET_m) or USBIN-VIN connection. The system solution is simplified, and a relatively large VSYS capacitor (CSYS_s) is eliminated, which may be ~20 μF for contemporary chargers. Furthermore, there may be unified trim procedures for charger current and input current sensing, such that only one trim step is performed.

Example Adaptive Battery Current Limiting

Figure 6:
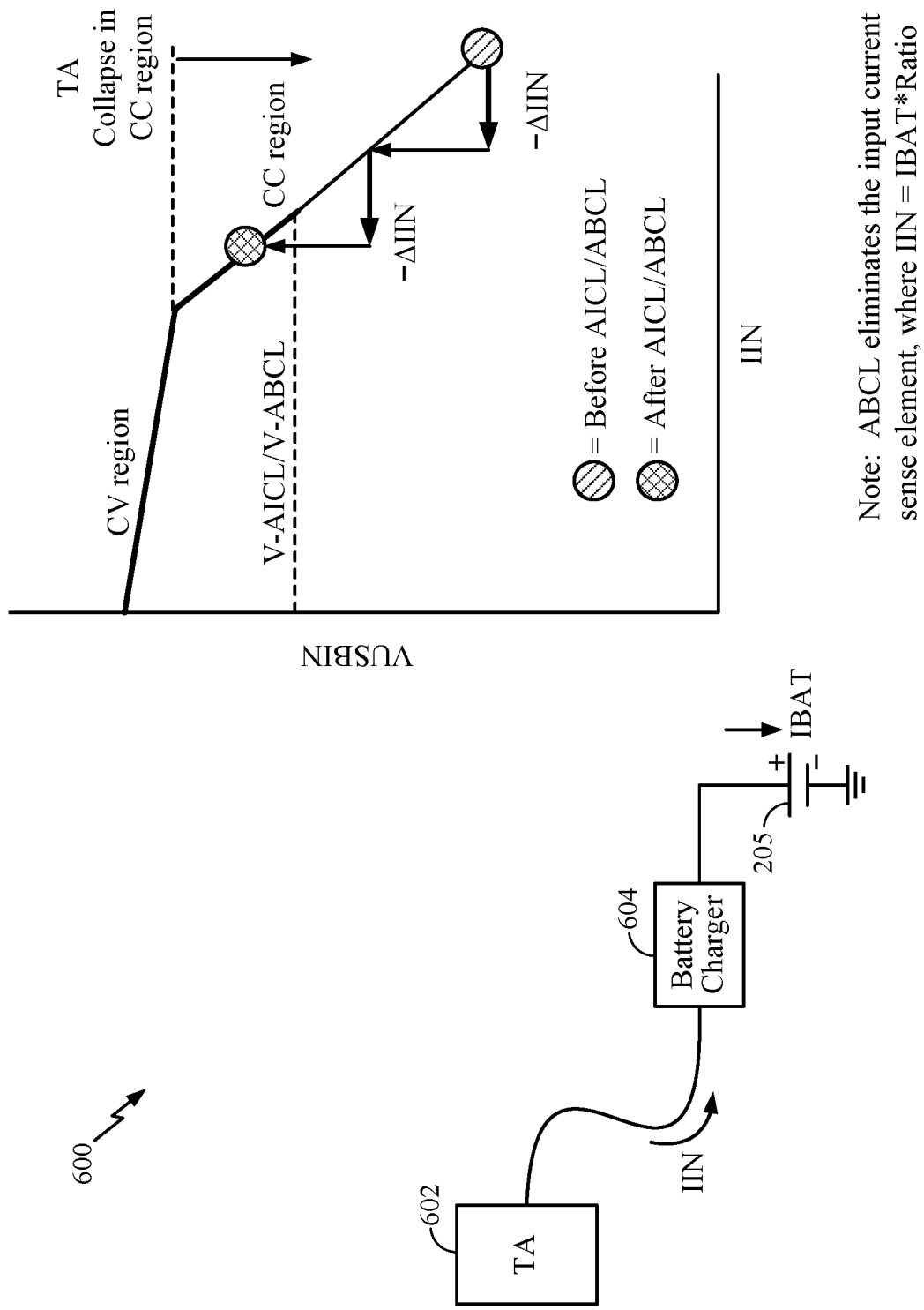
FIG. 6 illustrates adaptive input current limiting (AICL) and adaptive battery current limiting (ABCL).

FIG. 6 provides a graph 600 illustrating the concept of adaptive input current limiting (AICL). AICL reduces the input current (IIN) from a travel adapter (TA) 602 to a battery charger 604 in digital increments (±ΔIIN), thereby preventing TA output voltage collapse, which in turn may maximize power from the TA. When TA collapse occurs, the output voltage VSUBIN falls drastically in the constant-current (CC) region, as illustrated in the graph 600. With AICL, IIN is reduced incrementally until the output voltage is above a voltage threshold (V-AICL). Eliminating the slave FPFET in a parallel battery charger (as described above) may make it difficult to implement AICL and prevent TA collapse (especially when using low-cost, low-performance AC/DC TAs), and also to minimize thermal profile, which is desired for implementing the fastest battery charging.

Certain aspects of the present disclosure provide techniques and apparatus for implementing adaptive battery current limiting (ABCL), in an effort to prevent TA collapse. ABCL involves modulating the battery current (IBAT) (e.g., through BATFET_s in the slave charging circuit) instead of the input current (IIN) (e.g., through the absent FPFET_s in the slave charging circuit), as in the case of AICL.

Figure 7:
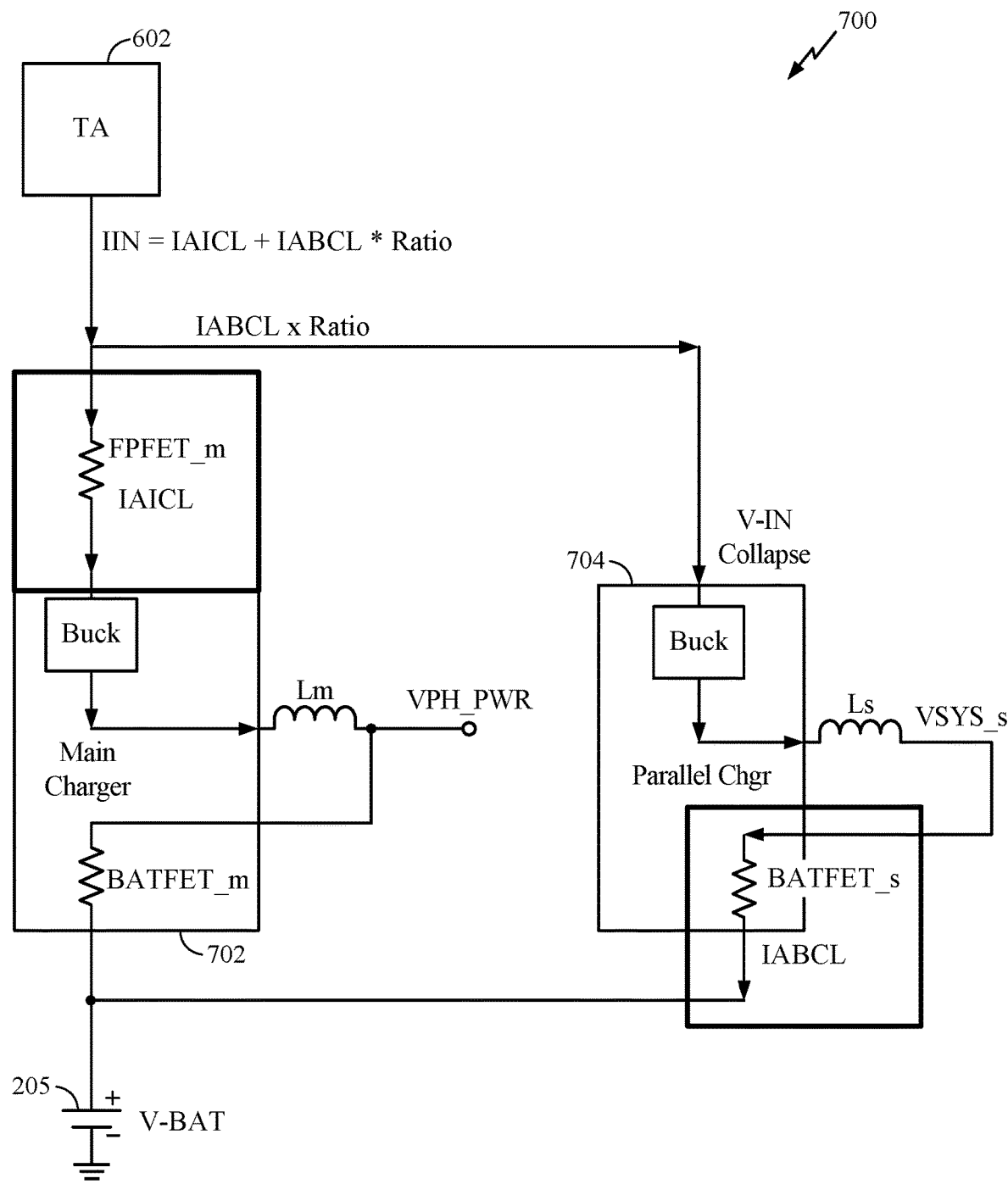
FIG. 7 is an example circuit diagram illustrating the concept of ABCL, in accordance with certain aspects of the present disclosure.

FIG. 7 is a block diagram of an example circuit 700 illustrating the concept of ABCL, in accordance with certain aspects of the present disclosure. The AICL method through the FPFET_m (illustrated by its drain-to-source on-resistance) with current IAICL is illustrated in the main charging circuit 702 (e.g., the master charging circuit 202). The ABCL method is illustrated on the parallel charging circuit 704 (e.g., the slave charging circuit 204), which involves the current IABCL through the slave battery field-effect transistor (BATFET_s). Because the parallel charging circuit 704 has no system load (e.g., at the VSYS_s terminal), the BATFET_s current-sensing element (e.g., current-sensing circuit 301) can be used. And because the TA collapse affects both the main and parallel charging circuits 702, 704, the input collapse may be controlled directly by modulating the current through BATFET_s.

Programmability of the battery current via BATFET_s allows the battery current to scale, create a facsimile of actual input current (IABCL*Ratio), and balance the load on the TA 602 of the main and parallel charging circuits 702, 704. This main/parallel load allocation may be maintained during TA collapse. The Ratio may be proportional to approximately V-BAT/V-IN, where V-BAT is the battery voltage and V-IN is the output voltage of the TA 602, which is also the input voltage to the main and parallel charging circuits 702, 704. The battery current may be stepped (e.g., decremented) in any of various suitable increments, such as 25, 50, or 100 mA steps. The time between battery current steps may be any of various suitable intervals, such as 2.5, 5, 15, or 20 ms. ABCL may also use a programmable deglitch time of any suitable length, such as 30 μs, 1 ms, 3 ms, or 10 ms.

During operation of the circuit 700, the parallel charging circuit 704 may determine that V-IN has fallen below the ABCL threshold voltage (V-ABCL). V-ABCL may be considered as being analogous to V-AICL in the graph 600, but for ABCL instead of AICL. Based on the determination that V-IN is less than V-ABCL, a counter may be triggered to begin counting. The duty cycles of the gate drive signals may be incrementally adjusted (e.g., using pulse-width modulation (PWM)) to reduce IABCL through BATFET_s (according to the selected step-down size). After V-IN from the TA 602 is determined to be above V-ABCL, the counter may be stopped, and the duty cycles of the gate drive signals may stay at the adjusted value. In this manner, duty-cycle control of the sensed battery current may be employed to prevent input collapse of the TA 602.

Returning to FIG. 5, according to certain aspects, the operations 500 further involve sensing an input voltage at an input of the second converter, determining that the input voltage is below a threshold voltage, and controlling the second converter based on the determination. For certain aspects, the second converter includes a first transistor, a second transistor coupled to the first transistor, and an inductor having a terminal coupled to a node between the first and second transistors and another terminal coupled to the output of the second converter. In this case, controlling the second converter may include incrementally adjusting duty cycles of signals driving gates of the first and second transistors to incrementally decrease the charging current until the input voltage is determined to be above the threshold voltage. This may include using pulse-width modulation, for example.

The ABCL described herein provides a means to indirectly control the TA output current (IIN=IAICL+IABCL*Ratio), and thus prevent input voltage collapse to the battery charger, by dynamically modulating the battery charging current. This technique allows the charger to eliminate the large input current sense FET (FPFET_s), which is employed by previous generation parallel chargers.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, first means for converting a first current may include a DC/DC converter, such as a buck converter in a charging circuit (e.g., HSFET_m, LSFET_m, and Lm in master charging circuit 202 as illustrated in FIG. 2A). Second means for converting a second current may include a DC/DC converter, such as a buck converter in a charging circuit (e.g., HSFET_s, LSFET_s, and Ls in slave charging circuit 204 as depicted in FIG. 2A). Means for sensing a charging current may include a current-sensing circuit (e.g., current-sensing circuit 301 as depicted in FIG. 3A). Means for regulating the charging current may include one or more transistors (e.g., HSFET_s and/or LSFET_s as illustrated in FIGS. 2A, 3A, and 4), one or more control signals (e.g., gate drive signal(s)) for the transistor(s), such as HSON_s and/or LSON_s as shown in FIG. 3A), and/or a control circuit (control circuit 302 as depicted in FIG. 3A) for producing the control signal(s). Means for blocking a reverse current may include a transistor (e.g., BATFET_s as illustrated in FIGS. 2A, 3A, and 4), a control signal for a substrate (i.e., body or bulk) of the transistor, and/or a control circuit (e.g., switches S5 and S6 as depicted in FIG. 4 and/or control circuit 302 as illustrated in FIG. 3A) for generating the control signal. Means for sensing an input voltage, means for comparing the input voltage to a threshold voltage, and/or means for incrementally decreasing the charging current may include a control circuit (e.g., control circuit 302 as illustrated in FIG. 3A) for producing one or more control signals (e.g., gate drive signal(s)) for the transistor(s), such as HSON_s and/or LSON_s as shown in FIG. 3A).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A battery charging circuit comprising:
   a first charging circuit comprising:
      a first charging output connectable to a battery; and
      a first converter to provide power to the first charging output; and
   a second charging circuit comprising:
      a second charging output connectable to the battery;
      a second converter to provide power to the second charging output;
      a first transistor coupled between an output of the second converter and the second charging output; and
      a current-sensing circuit coupled to the output of the second converter to sense a current through the first transistor, the current sensing circuit comprising:
         a second transistor coupled to the output of the second converter;
         a sensing resistor;
         a third transistor coupled between the second transistor and the sensing resistor; and
         an amplifier having a first input coupled to at least one of the first transistor or the second charging output, a second input coupled to a node between the second transistor and the third transistor, and an output coupled to the third transistor.

2. The battery charging circuit of claim 1, further comprising:
   a first switch having a terminal coupled to the sensing resistor; and
   a low-pass filter circuit having an input coupled to another terminal of the first switch.

3. The battery charging circuit of claim 2, further comprising a second switch having:
   a terminal coupled to a node between the other terminal of the first switch and the input of the low-pass filter circuit; and
   another terminal coupled to a reference potential node for the second charging circuit.

4. The battery charging circuit of claim 3, further comprising a control circuit having a first output coupled to a control terminal of the first switch and a second output coupled to a control terminal of the second switch.

5. The battery charging circuit of claim 4, wherein the control circuit comprises a plurality of outputs coupled to the second converter and an input coupled to an output of the low-pass filter circuit and wherein the control circuit is configured to control the second converter based on a feedback signal received at the input of the control circuit from the low-pass filter circuit.

6. The battery charging circuit of claim 1, wherein the first transistor comprises a field-effect transistor (FET).

7. The battery charging circuit of claim 6, further comprising:
   a first switch coupled between a source and a body of the FET; and
   a second switch coupled between the body of the FET and a reference potential node for the second charging circuit.

8. The battery charging circuit of claim 7, further comprising a control circuit having an output coupled to at least one of a control terminal of the first switch or a control terminal of the second switch.

9. The battery charging circuit of claim 8, further comprising:
   a third switch coupled between another output of the control circuit and a gate of the FET, wherein a control terminal of the third switch is coupled to the control terminal of the first switch; and
   a fourth switch coupled between the gate of the FET and the reference potential node for the second charging circuit, wherein a control terminal of the fourth switch is coupled to the control terminal of the second switch.

10. The battery charging circuit of claim 1, wherein the first charging circuit further comprises:
   a first input voltage terminal; and
   a second transistor coupled between the first input voltage terminal and an input of the first converter.

11. The battery charging circuit of claim 10, wherein the second charging circuit further comprises a second input voltage terminal coupled directly to an input of the second converter.

12. The battery charging circuit of claim 11, wherein the first input voltage terminal of the first charging circuit is coupled to the second input voltage terminal of the second charging circuit.

13. A power management integrated circuit (PMIC) comprising the battery charging circuit of claim 1.

14. A method of operating a battery charging circuit comprising a first charging circuit and a second charging circuit for concurrently charging a battery, the method comprising:
   driving a first converter in the first charging circuit;
   driving a second converter in the second charging circuit;
   sensing a charging current for charging the battery from the second charging circuit, based on an output of the second converter, to effectively sense an input current for the second charging circuit;
   sensing an input voltage at an input of the second converter;

determining that the input voltage is below a threshold voltage; and controlling the second converter based on the determination.

15. The method of claim 14, wherein the second charging circuit comprises:
    a first transistor coupled between the output of the second converter and the battery;
    a second transistor coupled to the output of the second converter;
    a sensing resistor;
    a third transistor coupled between the second transistor and the sensing resistor; and
    an amplifier having a first input coupled to the first transistor, a second input coupled to a node between the second transistor and the third transistor, and an output coupled to the third transistor.

16. The method of claim 15, wherein sensing the charging current to effectively sense the input current comprises:
    driving a gate of the first transistor and a gate of the second transistor with a same gate voltage; and
    driving a gate of the third transistor with the output of the amplifier such that a first voltage at the first input is equal to a second voltage at the second input.

17. The method of claim 15, wherein sensing the charging current to effectively sense the input current comprises:
    closing a first switch having a terminal coupled to the third transistor and to the sensing resistor during a first interval; and
    opening the first switch during a second interval, wherein the first and second intervals are based on timing of a control signal for a high-side transistor in the second converter.

18. The method of claim 17, wherein sensing the charging current to effectively sense the input current further comprises:
    opening, during the first interval, a second switch coupled between another terminal of the first switch and a reference potential node of the second charging circuit;
    closing the second switch during the second interval; and
    low-pass filtering a voltage signal at the other terminal of the first switch during the first and second intervals, wherein the filtered voltage signal represents the input current for the second charging circuit.

19. The method of claim 15, further comprising:
    disabling charging by the battery charging circuit;
    disconnecting a gate of the first transistor from a control signal;
    connecting the gate of the first transistor to a reference potential node for the second charging circuit;
    disconnecting a body of the first transistor from a source of the first transistor; and
    connecting the body of the first transistor to the reference potential node for the second charging circuit.

20. The method of claim 19, further comprising:
    enabling charging by the battery charging circuit;
    disconnecting the gate of the first transistor from the reference potential node for the second charging circuit;
    connecting the gate of the first transistor to the control signal;
    disconnecting the body of the first transistor from the reference potential node for the second charging circuit; and
    connecting the body of the first transistor to the source of the first transistor.

21. The method of claim 14, wherein the second converter comprises a first transistor, a second transistor coupled to the first transistor, and an inductor having a terminal coupled to a node between the first and second transistors and wherein a capacitor coupled to another terminal of the inductor is absent from the second converter.

22. The method of claim 14, further comprising controlling the second converter based on the sensed charging current to adjust the charging current from the second charging circuit.

23. The method of claim 22, wherein:
    the second converter comprises a first transistor, a second transistor coupled to the first transistor, and an inductor having a terminal coupled to a node between the first and second transistors and another terminal coupled to the output of the second converter; and
    controlling the second converter comprises adjusting duty cycles of signals driving gates of the first and second transistors, based on the sensed charging current.

24. The method of claim 14, wherein:
    the second converter comprises a first transistor, a second transistor coupled to the first transistor, and an inductor having a terminal coupled to a node between the first and second transistors and another terminal coupled to the output of the second converter; and
    controlling the second converter comprises incrementally adjusting duty cycles of signals driving gates of the first and second transistors to incrementally decrease the charging current until the input voltage is determined to be above the threshold voltage.

25. An apparatus for charging a battery, comprising:
    first means for converting a first current;
    second means for converting a second current, the second means for converting being coupled to the first means for converting;
    means for sensing a charging current for charging the battery from the second means for converting, based on an output of the second means for converting, to effectively sense an input current for the second means for converting;
    means for sensing an input voltage at an input of the second means for regulating;
    means for comparing the input voltage to a threshold voltage; and
    means for incrementally decreasing the charging current, based on the input voltage being below the threshold voltage, until the input voltage is determined to be above the threshold voltage.

26. The apparatus of claim 25, further comprising means for regulating the charging current based on the sensed charging current.

27. The apparatus of claim 26, further comprising means for blocking a reverse current in at least one of the second means for converting or the means for sensing the charging current when charging is disabled.

* * * * *